United States Patent [19]

Kunisa et al.

[11] Patent Number: 6,141,787
[45] Date of Patent: Oct. 31, 2000

[54] DIGITAL MODULATION AND DEMODULATION

[75] Inventors: Akiomi Kunisa, Kasukabe; Nobuo Itoh, Nagoya, both of Japan

[73] Assignee: Sanyo Electric Co., Ltd., Osaka, Japan

[21] Appl. No.: 09/231,817

[22] Filed: Jan. 15, 1999

Related U.S. Application Data

[63] Continuation of application No. PCT/JP98/02167, May 18, 1998.

[51] Int. Cl.[7] .......................... H03M 13/15; H03M 13/31
[52] U.S. Cl. ............................. 714/769; 714/784; 341/58
[58] Field of Search ................................... 714/769, 784, 714/775; 341/58

[56] References Cited

U.S. PATENT DOCUMENTS

| 5,271,021 | 12/1993 | Berlekamp et al. | 371/37.1 |
| 5,671,236 | 9/1997 | Denissen et al. | 371/37.1 |

FOREIGN PATENT DOCUMENTS

| 63-253573 | 10/1988 | Japan . |
| 5-284035 | 10/1993 | Japan . |

OTHER PUBLICATIONS

Deng et al., "DC–Free Coset Codes", IEEE Transactions on Information Theory, vol. 34, No. 4, Jul. 1988, pp. 786–792.
O'Reilly et al., "Class of Disparity Reducing Transmission Codes with Embedded Error Protection", IEE Proceedings, vol. 137, Pt. 1, No. 2, Apr. 1990, pp. 73–77.
Popplewell et al., "Aspects of Combined Coding and Linear Modulation and its Application to Future Personal Communications Systems", Sixth Int'l, Conf. on Mobile Radio and Personal Communications, Dec. 1991, pp. 87–92.
Popplewell et al., "Runlength Limited Binary Error Control Codes", IEEE Proceedings–I, vol. 139, No. 3, Jun. 1992, pp. 349–355.

*Primary Examiner*—Stephen M. Baker
*Attorney, Agent, or Firm*—Armstrong, Westerman, Hattori, McLeland & Naughton

[57] ABSTRACT

A digital modulator which inputs a data stream to convert to a channel bit stream. The multiplexed data block is generated by multiplexing dummy data to any position within each data block cut out of the data stream one by one. The first Reed-Solomon code is generated by Reed-Solomon-encoding the multiplexed data block as an information part. A plurality of second Reed-Solomon codes are generated by adding a plurality of Reed-Solomon codes for scrambling each of which has identification data showing its scrambling pattern in the same position as that of the dummy data, and the code length of information part and parity part is the same as the first Reed-Solomon code. The second Reed-Solomon code in which the characteristics becomes desirable after modulation among the plurality of the second Reed-Solomon codes is set for output.

8 Claims, 18 Drawing Sheets

$W''(x)$: RS Code Polynomial after Conversion  
$R''(x)$: Receiving Polynomial  
$E(x)$: Error Polynomial

FIG. 3

Comparison of RS Code with RS Code multiplied by/added with Galois Field

| | | |
|---|---|---|
| Conventional RS code | Code Polynomial | $W(x) = I(x) \; x^{2s} + P(x)$ |
| | Receiving Polynomial | $R(x) = W(x) + E(x) = I(x) \; x^{2s} + P(x) + E(x)$ |
| | Syndrome Polynomial | $S(x) = R(x) \bmod G(x)$<br>$= \{ I(x) \; x^{2s} + P(x) + E(x) \} \bmod G(x)$<br>$= \{ I(x) \; x^{2s} + P(x) \} \bmod G(x) + E(x) \bmod G(x)$<br>$= E(x) \bmod G(x)$ |
| RS code multiplied by an element over Galois Field $\alpha^i$ for conversion | Code Polynomial | $W'(x) = \alpha^i \; W(x)$<br>$= \alpha^i \; \{ I(x) \; x^{2s} + P(x) \}$      $(i = 0, \ldots, 2^{n-2})$ |
| | Receiving Polynomial | $R'(x) = W'(x) + E(x) = \alpha^i \; \{ I(x) \; x^{2s} + P(x) \} + E(x)$ |
| | Syndrome Polynomial | $S'(x) = R'(x) \bmod G(x)$<br>$= [\alpha^i \; \{ I(x) \; x^{2s} + P(x) \} + E(x)] \bmod G(x)$<br>$= \alpha^i \; \{ I(x) \; x^{2s} + P(x) \} \bmod G(x) + E(x) \bmod G(x)$<br>$= E(x) \bmod G(x)$ |
| RS code added scrambling polynomial for conversion $Y(x)$ | Code Polynomial | $W''(x) = W(x) + Y(x)$<br>$= I(x) \; x^{2s} + P(x) + J(x) \; x^{2s} + Q(x)$ |
| | Receiving Polynomial | $R''(x) = W''(x) + E(x) = I(x) \; x^{2s} + P(x) + J(x) \; x^{2s} + Q(x) + E(x)$ |
| | Syndrome Polynomial | $S''(x) = R''(x) \bmod G(x)$<br>$= \{ I(x) \; x^{2s} + P(x) + J(x) \; x^{2s} + Q(x) + E(x) \} \bmod G(x)$<br>$= \{ I(x) \; x^{2s} + P(x) \} \bmod G(x) + \{ J(x) \; x^{2s} + Q(x) \} \bmod G(x) + E(x) \bmod G(x)$<br>$= E(x) \bmod G(x)$ |

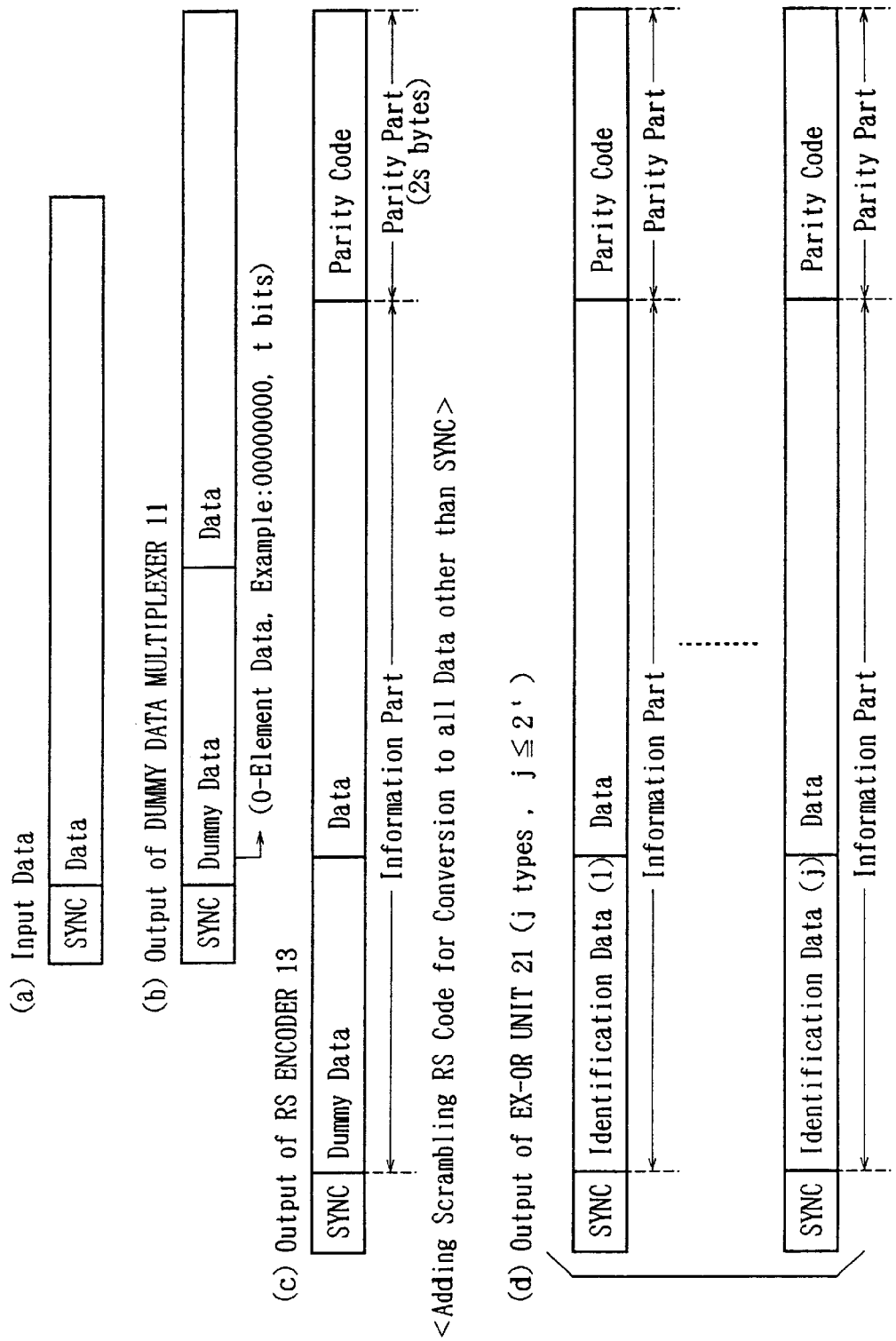

FIG. 8

Scrambling Pattern
(Output from INFORMATION PART GENERATOR for j types of CONVERSION 253, for the first data)

| 0000 | 0000 | 0000 | ...... | 0000 | ("0000" × u times) |
| 0001 | 0001 | 0001 | ...... | 0001 | ("0001" × u times) |
| ...... | | | | | |
| 1111 | 1111 | 1111 | ...... | 1111 | ("1111" × u times) |

⎱ 16 types ⎰

Scrambling Pattern
(Output from INFORMATION PART GENERATOR for j types of CONVERSION 253, for the data word of the second data)

| 0000 | 0000 | 0000 | ...... | 0000 | ("0000" × 2k-u times) |
| 0001 | 0001 | 0001 | ...... | 0001 | ("0001" × 2k-u times) |
| ...... | | | | | |
| 1111 | 1111 | 1111 | ...... | 1111 | ("1111" × 2k-u times) |

⎱ 16 types ⎰

FIG. 12 a = 8 (8-bit (=1-byte) Galois Field addition processing)

Output of RS ENCODER 12

| SYNC | 00000000 | DATA | Parity Code |

Information Part — Parity Part (2s bytes)

$\oplus$

Scrambling Pattern (for "11111111")

| 11111111 | 11111111 | ........ | 11111111 | 00011101 | 11001101 |

Information Part — Parity Part (2s bytes) (Uniquely fixed)

Output after EX-OR conversion

| SYNC | 11111111 | DATA (after conversion) | Parity Code(after conversion) |

Identification — Information Part — Parity Part (2s bytes)

DIGITAL MODULATION AND DEMODULATION

This Appln is a con't of PCT/JP98/02167 filed May 18, 1998.

BACKGROUND OF THE INVENTION

1. Field of the Invention

The present invention generally relates to digital modulation and demodulation, the former modulating a data stream into a bit stream suitable for recording or transmitting data, and the latter demodulating a bit stream regenerated from a recording medium or a transmission system into a data stream.

2. Description of the Related Art

A data stream composed of 1's and 0's is modulated into a bit stream conformable to the characteristics of an applicable recording medium, recording head, transmission medium, etc. Then, this bit stream is recorded into the recording medium or sent out to an applicable transmission system. For example, a data stream may be RLL-encoded, then NRZI-modulated, and then recorded into the recording medium. This way of recording can enhance the recording density. A data stream may also be NRZ- or NRZI-modulated, and then recorded in the recording medium.

In the RLL-coding, data words are cut out m-bit by m-bit from the input data stream, and each data word is converted into an n bit codeword. Restrictions are imposed on this RLL coding to increase the minimum value Tmin and to decrease the maximum value Tmax of time interval between adjacent transition. Specifically, restrictions are imposed so that the number of bits "0" existing between two bits "1" to be d or more and k or less. The codes to fulfill these restrictions are called "(d, k; m, n) RLL codes."

In the NRZI modulation, the RLL code is inverted by a bit "1" but not inverted by a bit "0." Thus, the bit interval between adjacent transitions in the bit stream after NRZI modulation is longer than that of the RLL code before NRZI modulation. For this reason, in comparison with a case where the bit stream before NRZI modulation is recorded in a recording medium and then regenerated, the waveform deterioration of the regenerated signal is smaller in a case where the bit stream after NRZI modulation is recorded into a recording medium and then regenerated. As a result, there is less frequent occurrence of read error. In other words, if nearly the same read error is permitted, the recording density of the case where a bit stream after NRZI modulation is recorded is higher than the case where a bit stream before NRZI modulation is recorded The bit stream for recording or transmitting data should preferably have the following characteristics:

(1) Tmin: The minimum time interval between adjacent transitions

Tmin is the product of "d+1" and Tw, where Tw is the duration of a channel bit. When the recording density is enhanced, the duration of the channel bit stream is shortened, and as a result, the regenerated signal may be easily deteriorated by inter-symbol interference. Thus, read errors may easily occur. Therefore, to reduce the inter-symbol interference that may occur when the bit stream is read from a recording medium with a high recording density, the Tmin should preferably be large.

(2) Tmax: The maximum time interval between adjacent transitions

Tmax is the product of "k+1" and Tw. Unless the transition occurs, no regenerated pulse can be obtained, and for this reason, the edge of the clock can not be positioned accurately at the center of the channel bit stream. If the same bit is generated for a long duration, a DC component is largely contained in a channel bit stream. Therefore, Tmax should preferably be small.

(3) DC or low-frequency component

A recorder for recording a bit stream into a recording medium and a regenerator for regenerating a signal recorded in a recording medium have AC coupling elements. A unit for converting a bit stream to an analog signal and sending out the same to a transmission system and a unit for regenerating an analog signal received from a transmission system also have AC coupling elements. Thus, when the analog recording or sending signal produced from bit streams has a DC component, the AC coupling elements deteriorate the waveform of this signal, which is not preferable. Furthermore, the DC component lost due to this deterioration cannot be restored. Therefore, it is preferable that the DC or low-frequency component should be small. For evaluating the DC or low-frequency component of the recording signal, a DSV (Digital Sum Value) is used. The DSV takes a bit "1" as "+1" and a bit "0" as "−1," and obtains the accumulated value of a recording bit stream from the head thereof. The smaller the absolute value of the DSV is, the smaller is the DC or low-frequency component. For the evaluation of the DC or low-frequency component in each code word within the recording signal, a CDS (Codeword Digital Sum) is used. The CDS is the DSV within each code word. The smaller is the CDS, the smaller is the DC or low-frequency component of code word.

(4) Tw: Duration of channel bit (window margin)

The detection window margin Tw is given by (m/n)T, where T is the bit interval of the data stream before modulation. The detection window margin TW indicates the time available to the detection of the channel bit, i.e., resolution. It also indicates the tolerance of the phase variation of the regenerated signal due to inter symbol interference, noise or the like. It is preferable that Tw should be large.

(5) Lc: Constraint length

Encoding may be made by referring to the preset codewords and the future codewords as well as the current codeword to improve Tmin, Tmax and the DSV. Here, the length of the codewords to be referred to is called a "constraint length Lc." The larger Lc is, the larger the propagation of error during demodulation is, and the more complicated the circuitry is. For this reason, it is preferable that LC should be small.

The Japanese publication No.52-128024 of unexamined patent application discloses a technique to make Tmin of the recording bit stream after NRZI modulation larger and Tmax of the same smaller. According to this publication, a (1, 7; 2, 3) RLL code table is used by the RLL coding, i.e., by cutting out a 2-bit data word from the input data stream and translating it into a 3-bit codeword, respectively. The bit stream of the RLL code thus generated is NRZI-modulated. If restriction of d=1 fails to be satisfied, a (1, 7; 4, 6) RLL code table is used.

The Japanese publication No. 1-27510 of examined application discloses a technique to reduce the DC component of the channel bit stream, i.e., an RLL coding technique, to prevent Tmin of the channel bit stream from being reduced. According to this publication, n-bit codewords are cut one-by-one from the bit stream after RLL encoding and a plurality of redundant bits are inserted into each space between the adjoining codewords, and the bit stream inserted with these redundant bits is supplied to the NRZI modulation circuit. These redundant bits are selected based on the necessity of inversion of the codeword before which the redundant bits are to be inserted and also on the state of the tail-end part of the codeword immediately before the redundant bits. That is, the selection is so made that the DC component of the channel bit stream can be reduced and Tmin can be prevented from being reduced.

The Japanese publication No. 5-34747 of examined application discloses a code conversion method which enables Tmin to be 1.5 T, Tmax to be 4.5 T and Lc to be 5 T by adjusting the conversion rules for translating the data stream into an RLL code stream according to the arrangement of the data stream.

The Japanese publication No. 4-77991 of examined application discloses a technique to reduce the DC components of the channel bit stream and increase Tmin. According to this publication, 8-bit data words are cut out one by one from the input data stream, and each data word is translated into a 14-bit code word. In this conversion, the number of bits "0" between the bit "1" and the bit "1" is 1 or more and 8 or less in the translated bit stream. Two different tables for translating 8-bit data words into 14-bit code words are available. The codeword of either of these tables is selected according to the DSV at the end of the codeword translated immediately before. That is, the selection is made so that the DC components of the channel bit stream can be reduced.

The Japanese publication No. 6-311042 of unexamined application discloses a technique for sufficiently reducing the DC components of the channel bit stream and improve the recording density ratio (DR) by increasing Tmin. According to this publication, the 8-bit data words are cut out one-by-one from the input data stream, and each data word is translated into a 17-bit codeword. In this conversion, the number of bits "0" between the bit "1" and the bit "1" is two or more and nine or less in the translated bit stream. The above 17-bit codeword can be obtained by multiplexing a 2-bit redundant bit to the 15-bit code word corresponding to the 8-bit data word. According to the Japanese Unexamined Patent Publication No. 6-311042, two different tables for corresponding the 8-bit data word to the 15-bit codeword are available, and 3 different 2-bit redundant bits are also available. From among the six different code words obtained by combining these two different tables and three different redundant bits, the above 8-bit data word is converted to the 17-bit code word selected according to the DSV at the end of the data translated immediately before. That is, the above 8-bit data word is converted to the 17-bit code word selected so as to reduce the DC components of the channel bit.

SUMMARY OF THE INVENTION

According to the above techniques disclosed in the respective publications of patent applications, such techniques in which redundant bits are multiplexed into codewords or a plurality of conversion tables are prepared and the most suitable conversion table is selected for suppressing the DC or low-frequency components of the bit stream. For this reason, the restrictions related to the above "d" or "k" are eased, and this causes a problem that Tmin becomes smaller or Tmax becomes larger. Furthermore, as the number of bits of the code word becomes larger, there is a problem that Tw becomes smaller and the window margin becomes lower.

It is an object of the present invention to sufficiently suppress the DC or low-frequency components of the bit stream for recording or transmission. Preferably, it is also an object of the present invention to sufficiently suppress the DC or low-frequency components of the channel bit stream while controlling Tmin not to become too small and Tmax not to become large. It is another object of the present invention to improve the window margin by increasing Tw while sufficiently suppressing the DC or low-frequency components of the channel bit stream. It is still another object of the present invention to reduce the regeneration error and also reduce the propagation of the regeneration error.

Furthermore, it is still another object of the present invention to achieve the above objectives with a simple circuitry.

1. Galois field and Reed-Solomon Code

Now, Galois field and Reed-Solomon code, both of which are used for the present invention, will be described.

In Galois field GF ($2^t$), the four fundamental rules of arithmetic can be applied to $2^t$ types of numeric (elements). The addition/subtraction in the Galois field GF ($2^t$) is the arithmetic of mod2 in vector form, and both the addition and the subtraction have the same results.

In Reed-Solomon (RS) code, the code word comprises the elements of Galois field, where a t-bit element of Galois field corresponds to 1 code word. In other word, t bits are treated as 1 byte in data handling, and the data of each 1 byte is expressed as Galois field element over GF ($2^t$).

The code polynomial W(x), which is a polynomial expression of the RS code, can be obtained by obtaining remainder polynomial P(x) by dividing $I(x)x^{2s}$ by the generation polynomial G(x), where $I(x)x^{2s}$ is made by shifting the information polynomial I(x) by 2s bytes, and then by connecting the thus obtained remainder polynomial P(x) to the end of the 2s-byte shifted information polynomial $I(x)x^{2s}$. That is, the remainder polynomial P(x) is obtained by using $$I(x)x^{2s} \bmod G(x) = P(x) \qquad \text{(Equation 1)}$$

Then, the code polynomial W(x) is expressed by using the thus obtained P(x) as $$W(x) = I(x)x^{2s} + P(x) \qquad \text{(Equation 2)}$$

Where A mod B is the remainder when A is divided by B.

The receiving polynomial R(x), which is the polynomial expression of the received RS code, can be expressed as $$\begin{aligned} R(x) &= W(x) + E(x) \qquad &\text{(Equation 3)} \\ &= I(x)x^{2s} + P(x) + E(x) \end{aligned}$$

where E(x) is the error polynomial to express the generated error.

The syndrome polynomial S(x) for checking errors can be obtained by dividing the receiving polynomial R(x) by the generation polynomial G(x). That is, as shown in the top of FIG. 3, $$\begin{aligned} S(x) &= R(x) \bmod G(x) \qquad &\text{(Equation 4)} \\ &= \{W(x) + E(x)\} \bmod G(x) \\ &= E(x) \bmod G(x) \end{aligned}$$

As it is evident from Equation 4, if an error occurs, the syndrome polynomial S(x) can no longer be divided by the generation polynomial G(x) with the result that the error can be corrected on condition that the error is s bytes or less. Here, Equation 4 utilizes the fact that the code polynomial W(x) can be divided by the generation polynomial G(x).

2. Principle of the Present Invention

According to the present invention, the code polynomial W(x) obtained from the constant number of data words cut out one-by-one from the data stream are added with a plurality types of the code polynomials for scrambling Y1(x), Y2(x), ..., Yj(x) as shown in FIG. 1 to generate a plurality types of the code polynomials W"1(x), W"2(x), ..., W"j(x). Then, from these code polynomials W"1(x), W"2(x), ..., W"j(x), the code polynomial with the desirable characteristics is selected. For example, as the desirable characteristics, the code polynomial W"i(x) with the minimum DC components of the recording signal is selected. Then, to the thus selected code polynomial W"i(x), the RLL modulation or NRZI modulation is applied, if necessary, to make the bit stream for recording.

Also, according to the present invention, by utilizing the fact that the above discussion of the receiving polynomial R(x) and syndrome polynomial S(x) of the original code polynomial W(x) can also be applied to the receiving polynomial R"i(x) and syndrome polynomial S"i(x) of the code polynomial W"i(x) thus selected from the plurality types of code polynomials W"1(x), W"2(x), ..., W"j(x) generated by the above scrambling (where i is the selected), i.e., that $$S''(x) = R''(x) \bmod G(x) \quad \text{(Equation 5)}$$
$$= \{W''(x) + E(x)\} \bmod G(x)$$
$$= E(x) \bmod G(x)$$

shown at the bottom of FIG. 3 can be applied to the receiving polynomial R" i(x) and syndrome polynomial S"i(x) of the code polynomial W"i(x), the error of the receiving polynomial R"i(x) on the decoder side that generates the original data stream from the regenerated signal is corrected to obtain the code polynomial W"i(x). Here, FIG. 2 shows the relation among W"(x), E(x) and R"(x).

Furthermore, according to the present invention, the original polynomial W(x) is obtained by adding the code polynomial for scrambling Yi(x) used for the generation of the code polynomial W"i(x) to the code polynomial after error correction W"i(x).

Moreover, according to the present invention, as it is necessary to add the code polynomial for scrambling Yi(x) on the decoder side that generates the original data stream from the regenerated signal as described above, the identification information of the code polynomial for scrambling Yi(x) is detected from the code polynomial after error correction W"i(x). In other words, the code polynomial W" i(x) is added by the code polynomial for scrambling Yi(x) decided with the above identification information. Specifically, the data in the code polynomial W"i(x), which is located at the same position as the dummy data added to the inside of the original code polynomial W(x), is detected as the identification information.

BRIEF DESCRIPTION OF THE DRAWINGS

FIG. 3 is a descriptive chart showing that the syndrome polynomial S(x) of the code polynomial W(x) is equal to the syndrome polynomial S"(x) of the code polynomial W"(x) obtained by adding the polynomial for scrambling Y(x) to the code polynomial W(x);

FIG. 4 is a descriptive chart showing the inputs/outputs of blocks within a modulation circuit shown in FIG. 5;

FIG. 8 is a descriptive chart showing a part of the scrambling patterns for the first data item and the second data item shown in FIG. 7;

FIG. 12 is a descriptive chart showing a scrambling method and identification data for a case where the dummy data to be added at the head of the data block is set to 8 bits;

THE BEST EMBODIMENTS OF THE INVENTION

Figure 1:
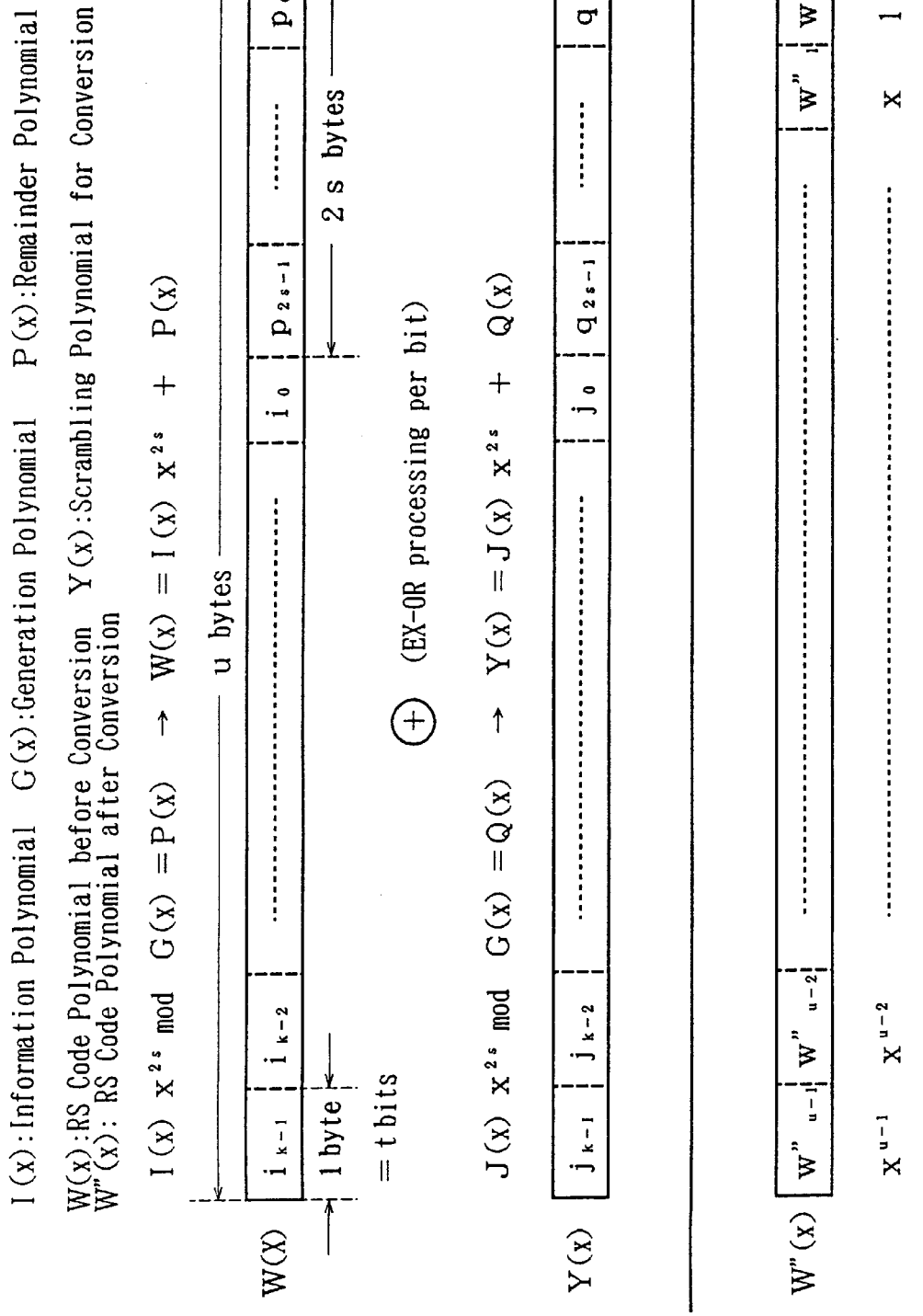
FIG. 1 is a descriptive chart showing the generation of the code polynomial W"(x) by adding the polynomial for scrambling Y(x) to the code polynomial W(x) which is the constant number of data words cut out of a data stream.
Figure 2:
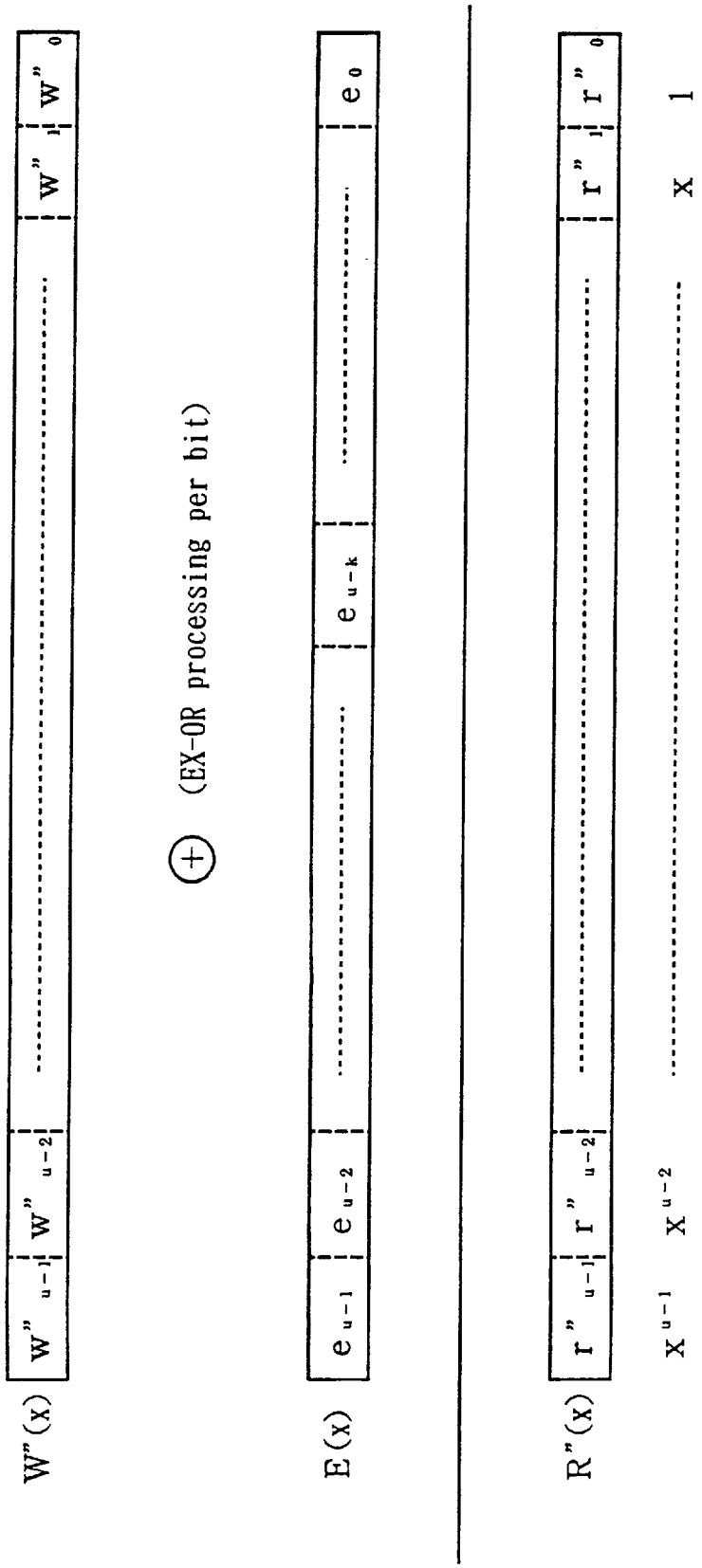
FIG. 2 is a descriptive chart showing that the receiving polynomial R"(x) is described in a form in which the error polynomial E(x) is added to the code polynomial after conversion W"(x)
Figure 5:
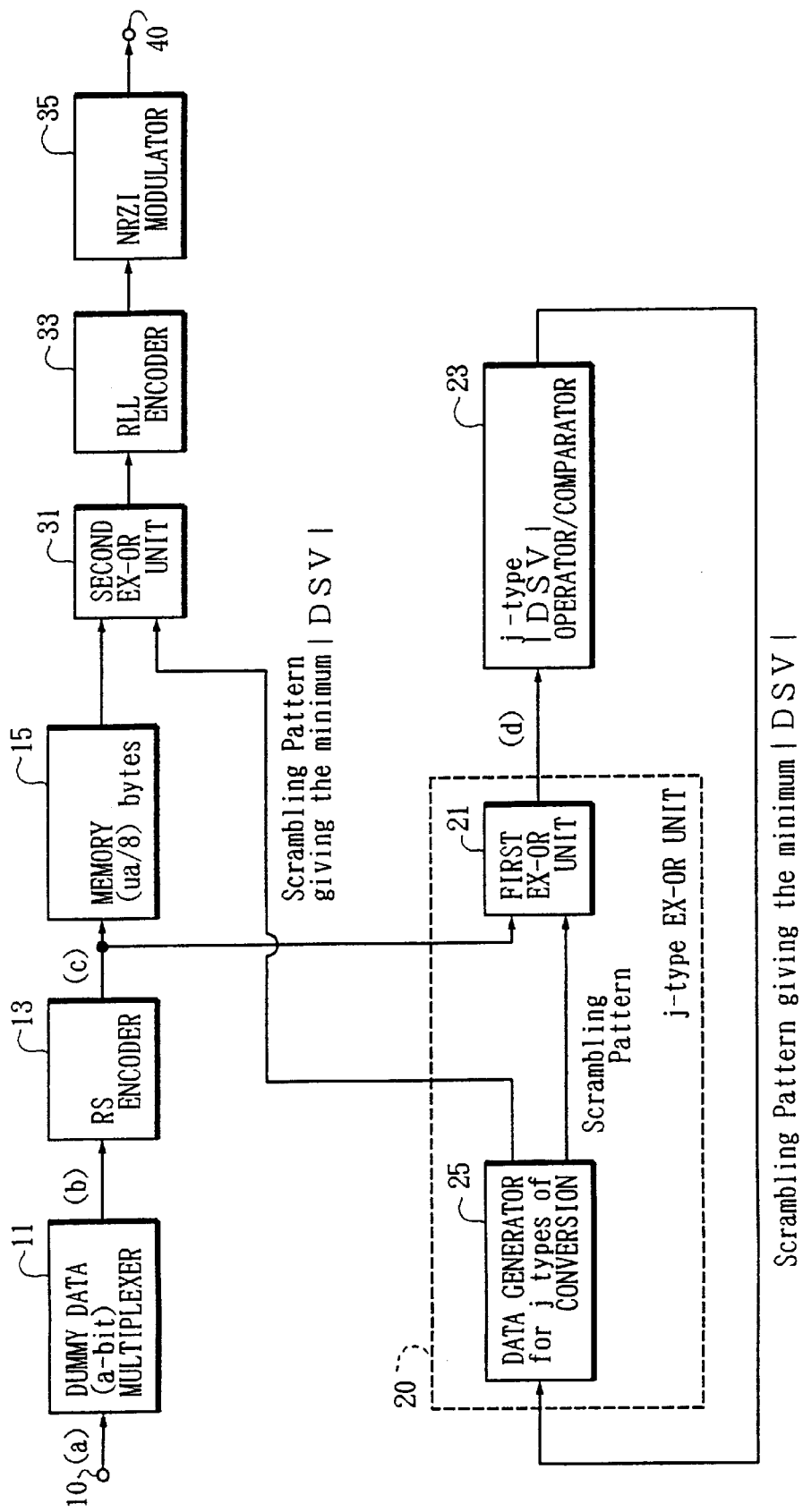
FIG. 5 is a block diagram of the modulation circuit according to an embodiment.
Figure 6:
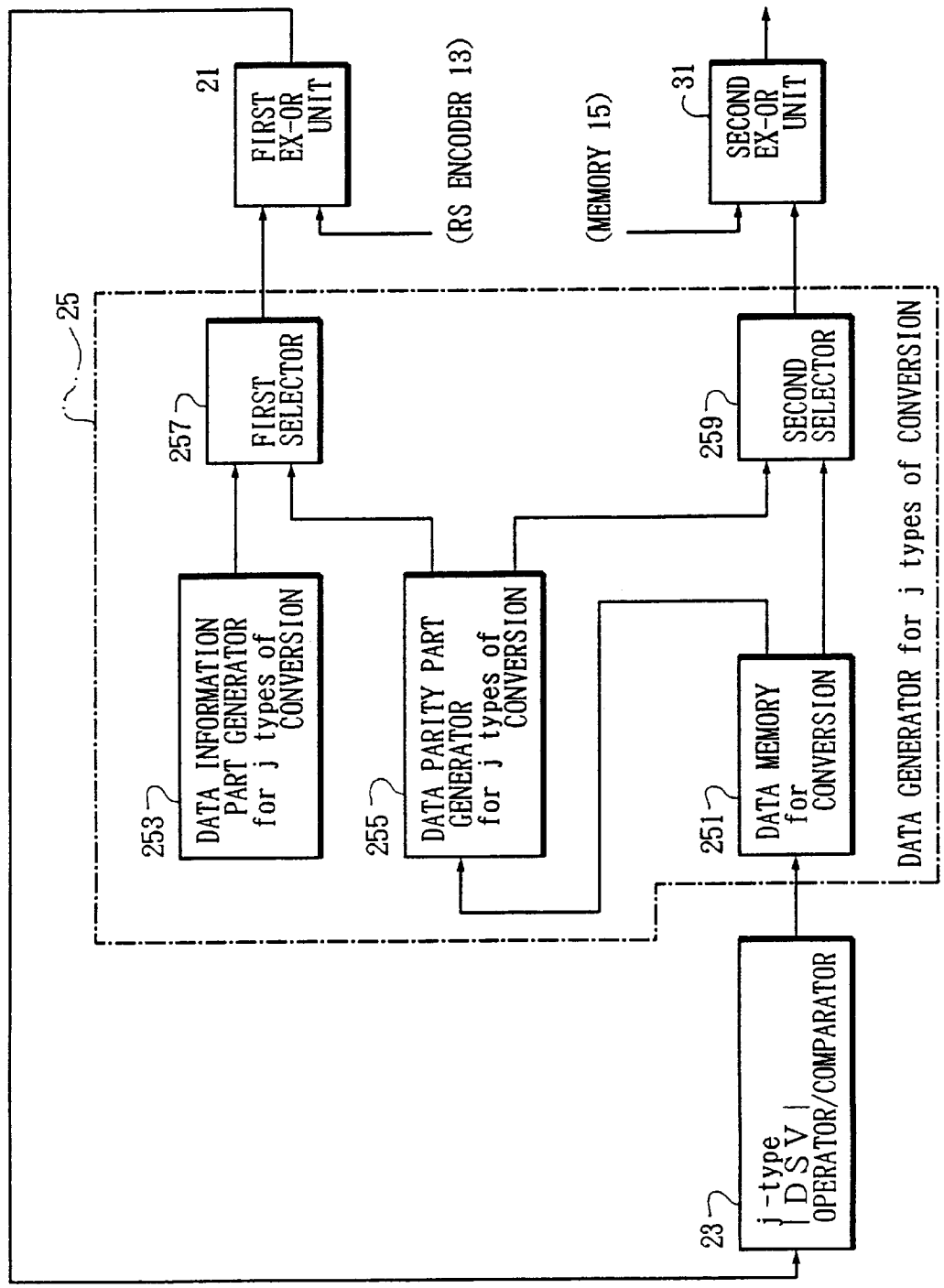
FIG. 6 is a block diagram showing mainly a data generator 25 for j types of conversion shown in FIG. 5.

FIG. 5 is a block diagram of a modulation circuit according to an embodiment. FIG. 6 is a block diagram showing the details around a j-type EX-OR unit 20. FIG. 4 is a descriptive chart showing the data configuration of I/O signals (a) and (b) of a dummy data multiplexer 11, I/O signals (b) and (c) of an RS encoder 13, and an output signal (d) of a first EX-OR unit 21, shown in FIG. 5, respectively.

The modulation circuit shown in FIG. 5 is a circuit which selects the code polynomial W"(x) having the minimum DC components of recording signal and modulates such code polynomial W"(x). This modulation circuit has a dummy data multiplexer 11, an RS encoder 13, a j-type EX-OR unit 20 containing a data generator for j types of conversion 25 and a first EX-OR unit 21, a j-type DSV operator/comparator 23, a memory 15, a second EX-OR unit 31, an RLL encoder 33, an NRZI modulator 35 and an output terminal 40.

The dummy data multiplexer 11 multiplexes a predetermined element over Galois field GF($2^r$) (e.g., 0 element over Galois field GF($2^8$): "00000000"), as shown in the second stage in FIG. 4, as dummy data to the head of each data block having a predetermined bits cut out of the data stream input from an input terminal 10. The data block multiplexed the dummy data into is called "multiplexed data block" in this specification.

The RS encoder 13 encodes the multiplexed data block as an information part to generate the Reed-Solomon code shown in the third stage in FIG. 4 ("the first Reed-Solomon code").

The j-type EX-OR unit 20 adds a plurality of types (j types) of Reed-Solomon codes for scrambling to the first Reed-Solomon code, respectively, to generate a plurality of types (j types) of Reed-Solomon codes (the "second Reed-Solomon codes"). That is, when a plurality of types (j types) of Reed-Solomon codes for scrambling are output from the data generator for j types of conversion 25 to the first EX-OR unit 21 one by one and thereby added to the first Reed-Solomon code by the first EX-OR unit 21, respectively, a plurality of types (j types) of the second Reed-Solomon codes are generated. Here, a plurality of types (j types) of Reed-Solomon codes for scrambling correspond to the above Y1(x), Y2(x), . . . , Yj(x), while a plurality of types (j types) of the second Reed-Solomon codes correspond to the above W"1(x), W"2(x), . . . , W"j(x).

The j-type DSV operator/comparator 23 selects the second Reed-Solomon code whose absolute DSV is the smallest after RLL-coding and NRZI recording, i.e., the second Reed-Solomon code whose DC or low-frequency components of the channel bit is the smallest, from a plurality of types (j types) of the second Reed-Solomon codes. The j-type DSV operator/comparator 23 also outputs identification data indicating the Reed-Solomon code for scrambling used for the generation of the selected second Reed-Solomon code to the data generator for j types of conversion 25. The second Reed-Solomon code whose absolute DSV after RLL-coding and NRZI recording is the smallest corresponds to the above W"i(x). Hereinafter, such second Reed-Solomon code is called the "best second Reed-Solomon code." Here, although this embodiment is of such construction that the second Reed-Solomon code having the smallest DC components after RLL-coding and NRZI recording is selected as the desirable second Reed-Solomon code, the j-type DSV operator/comparator 23 is provided. However, if other characteristics are employed as features in selecting the desirable second Reed-Solomon code, circuit elements corresponding to such other features may be provided instead of the j-type DSV operator/comparator 23.

As described above, the data generator for j types of conversion 25 outputs a plurality of types (j types) of Reed-Solomon codes for scrambling one by one to the first EX-OR unit 21, and at the same time, outputs the Reed-Solomon code for scrambling specified by the identification data (the identification data indicating the Reed-Solomon code for scrambling used for generating the best second Reed-Solomon code from the first Reed-Solomon code) input from the j-type DSV operator/comparator 23. This Reed-Solomon code for scrambling used for the generation of the best second Reed-Solomon code correspond to the above-described Yi(x).

The memory 15 stores the first Reed-Solomon code input from the RS encoder 13.

The second EX-OR unit 31 adds the first Reed-Solomon code to the Reed-Solomon code for scrambling used for the generation of the smallest second Reed-Solomon code, and outputs the sum, i.e., the best second Reed-Solomon code, to the RLL encoder 33.

The RLL encoder 33 encodes the best second Reed-Solomon code, which is the output from the second EX-OR unit 31, into the RLL code and outputs it to the NRZI modulator 35.

The NRZI modulator 35 encodes the output from the RLL encoder 33 into the channel bit stream, and outputs it to the outside through the output terminal 40.

Figure 9:
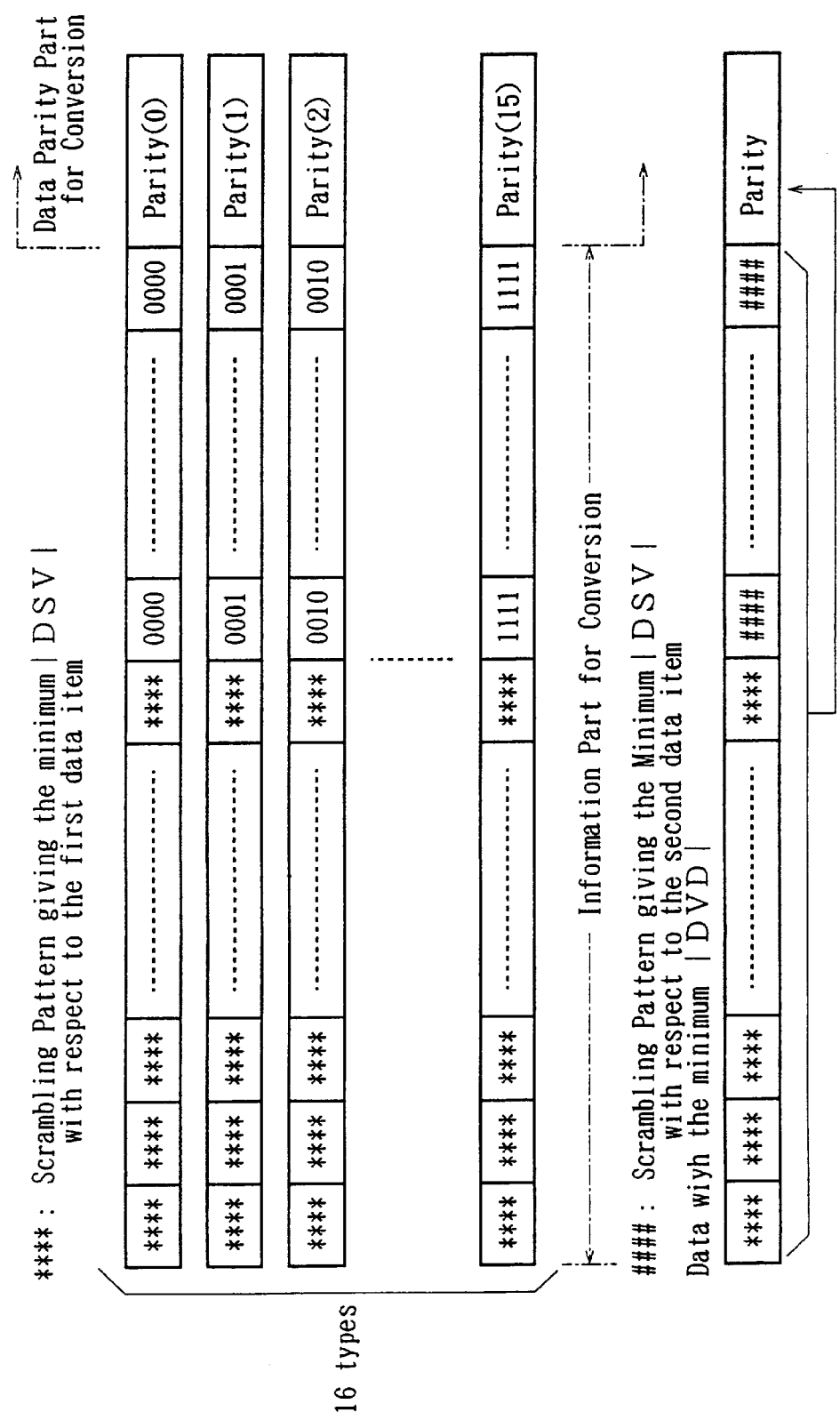
FIG. 9 is a descriptive chart showing the remaining part of the scrambling pattern for the second data item shown in FIG. 7.

Then, a case where two pairs of 4-bit redundant data "0000" and "0000" composing the predetermined 8-bit redundant data "00000000" are multiplexed to two predetermined positions, respectively, (at the beginning and center in this example) in the data block cut out of the data stream will be described referring to the above-described circuits and FIGS. 7 to 9.

Firstly, in the dummy data multiplexer 11, 2 pairs of 4-bit data elements "0000" and "0000" composing the predetermined 8-bit redundant data "00000000" are multiplexed as dummy data, respectively, to the positions within the data block. The one position corresponds to the head of the (k−1)-byte block cut out of the data stream and the other position corresponds to the head of the second half part (the position of (k−(u−1)/2) bytes from the end of the data block) of u-byte Reed-Solomon code with k bytes of information part which containes 2 pieces of 4-bit redundant data, i.e., 1 byte redundant data, to 1 data block (See the upper stage in FIG. 7). Here, the length of this multiplexed data block is k bytes.

Figure 7:
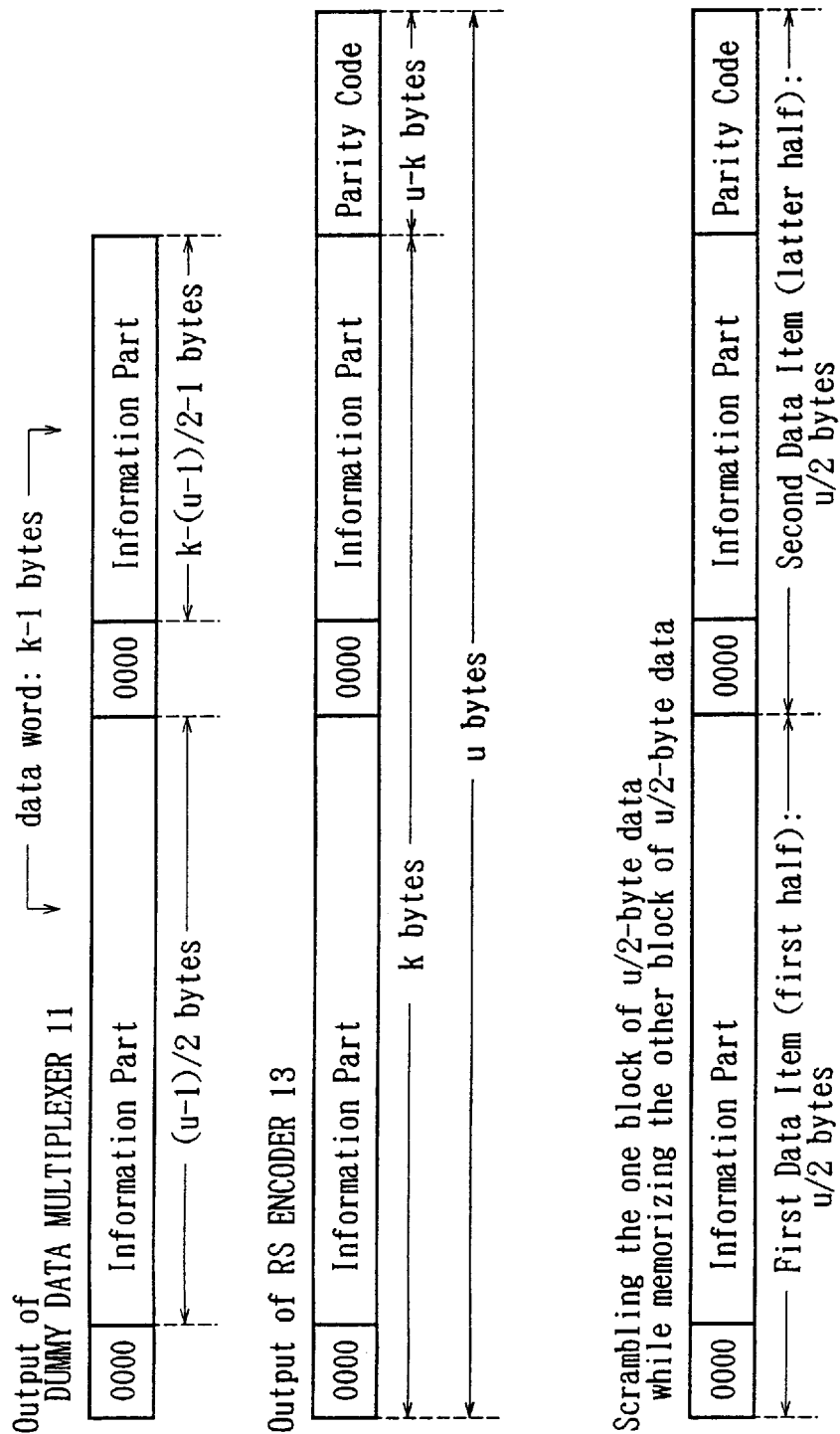
FIG. 7 is a descriptive chart showing a scrambling method for a case where the dummy data to be added at the head of the data block is set to 4 bits.

Next, in the RS encoder 13, the first Reed-Solomon code of u bytes is generated from the above multiplexed data block as information part (See the intermediate stage in FIG. 7). That is, (u−k) -byte parity code is added. Hereinafter, the first half part of the first Reed-Solomon code is called the "first data item," and the second half thereof is called the "second data item" (See the lower stage in FIG. 7).

While the first data item is stored into the memory 15, this first data item is scrambled as described below.

Firstly, each of the 16 types of 4-bit data shown in the upper stage in FIG. 8 are repeated for u times to be of (u/2)-byte data and each of the (u/2)-byte data sent out of an information part generator for j types of conversion 253 to the first EX-OR unit 21 through a first selector 257.

In the first EX-OR unit 21, EX-OR processing is made for each bit. Thereby, 16 types of first data items (the first half part of the second Reed-Solomon codes) are generated from the first data item shown in the lower stage in FIG. 7. In this case, as the dummy data is "0000," 4 bits at the head of first data items can serve as identification data as it is.

The 16 types of first data items (the first half part of the second Reed-Solomon codes) generated as described above are sent to the j-type DSV operator/comparator 23. From these 16 types of first data items, the first data item whose absolute DSV described above is the smallest (the first half part of the best second Reed-Solomon code), i.e., the first data item in which the DC components or low-frequency components of the channel bit stream are the smallest (the first half part of the best second Reed-Solomon code) is selected. The scrambling pattern used for the generation of such data item is stored in a memory for conversion 251.

Next, the second data item is scrambled. That is, each of the 16 types of 4-bit data shown in the lower stage in FIG. 8 are repeated for (2k−u) times, and sent from the information part generator for j types of conversion 253 to the first EX-OR unit 21 through the first selector 257. Then, 16 types of data items for parity parts from the parity (0) to the parity (15) shown in FIG. 9 are sent from a parity part generator for j types of conversion 255 to the first EX-OR unit 21 through the first selector 257. The parity (0) through the parity (15), which is the parity parts of the 16 types of second data items, are generated as shown in FIG. 9. That is, these parities are generated by Reed-Solomon-encoding 16 types of data blocks, respectively, each of which consists of first part having the scrambling pattern used for the generation of the first half part of the best second Reed-Solomon code (the scrambling pattern "***" used for the generation of the first data item in which the absolute value of DSV after RLL coding and NRZI recording is the smallest among the 16 types of first data items) and second part having one of 16 types of scrambling patterns shown in the lower stage in FIG. 8 ((2k−u) times of 4 bits). Here, the above-described scrambling pattern "*" is given from the memory for conversion 251 to the parity part generator for j types of conversion 255. The parity part generator for j types of conversion 255 may also be constructed with ROM which outputs 16 types of data items for the parity (0) through the parity (15) according to the combination of the scrambling pattern "***" for the first data item and the scrambling patterns "0000" through "1111" for the information part within the second data items.

On the other hand, the first data item stored in the memory 15 is read at the same time as the second data item is scrambled and input into the second EX-OR unit 31. Then, the first data item is added to the scrambling pattern "*****" which is repeated for u times and then input from the memory for conversion 251 through a second selector 259. As a result, the first half part of the best second Reed-Solomon code is generated.

On the other hand, almost exactly in the same way as the case of the first data item, the scrambling pattern leading to the minimum absolute DSV within the channel bit stream is obtained for the second data item, and then stored in the memory for conversion 251. That is, the scrambling pattern leading to the minimum DC components within the channel bit stream is obtained for the second data item, and then stored in the memory for conversion 251. In the case of the second data item, the scrambling pattern "####" for information part within the second data item of 4(2k−u) bits is stored.

Next, when the first data item of the next data block is scrambled in the same way as above, the above scrambling pattern "####" is sent from the memory for conversion 251 through the second selector 259 to the second EX-OR unit 31. Then, the scrambling pattern is added to the information part within the second data item of the first Reed-Solomon code read from the memory 15. Then, the scrambling pattern "***" for the first data item and the scrambling pattern "####" for the second data item are sent to the parity part generator for j types of conversion 255. Thereby, the data item of the parity part for conversion (one parity among from the parities (0) through (15)) corresponding to the combination of scrambling patterns "***" and "####" is sent from the parity generator for j types of conversion 255 to the second EX-OR unit 31 through the second selector 259. Then, the data item is added to the parity part within the second data item of the first Reed-Solomon code read from the memory 15.

The thus generated best second Reed-Solomon code is RLL-modulated and then NRZI-modulated.

Figure 14:
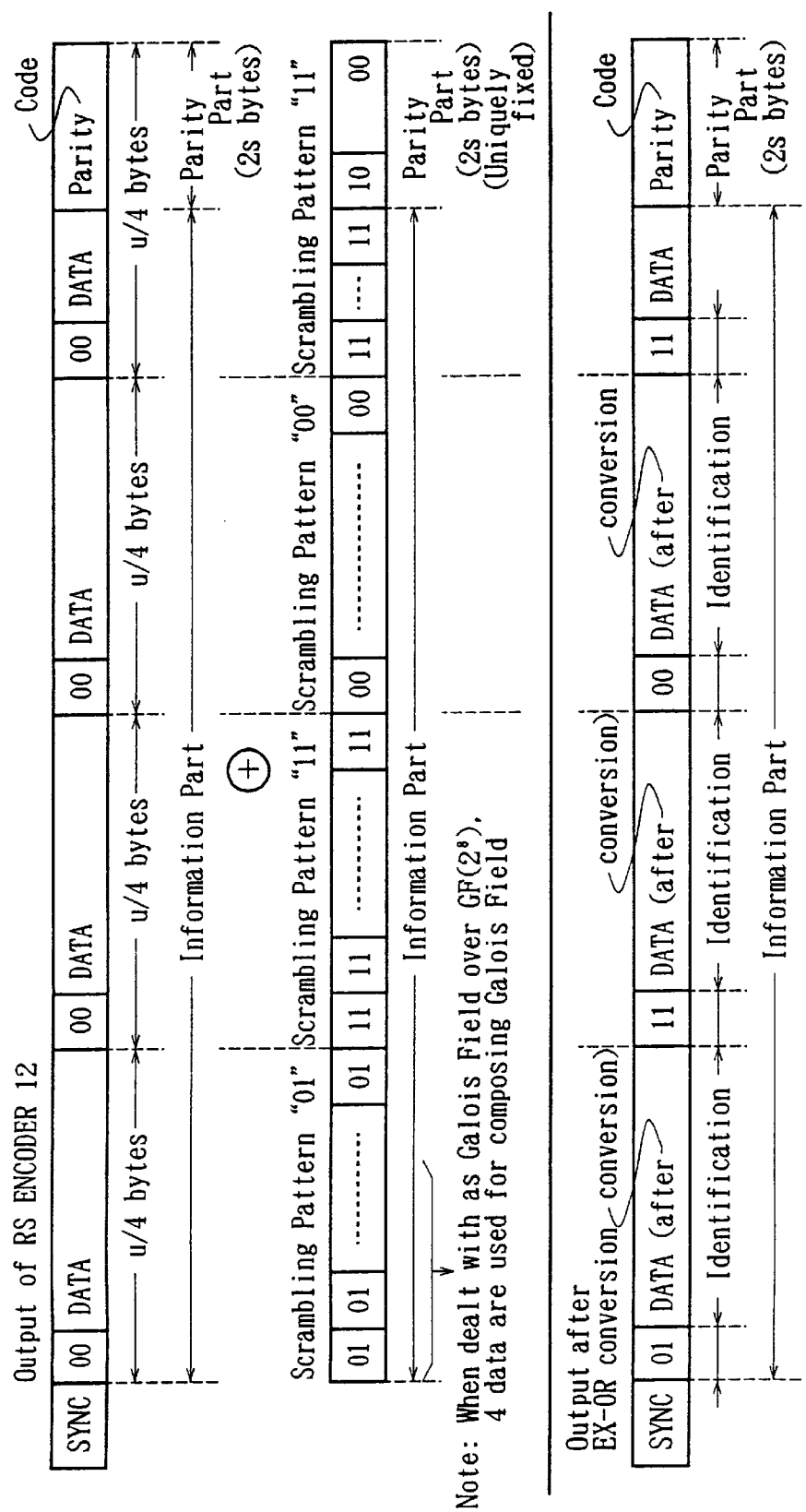
FIG. 14 is a descriptive chart showing a scrambling method and identification data for a case where the dummy data to be added at the head of the data block is set to 2 bits.

The above description refers to a case where 2 pairs of 4-bit redundant data "0000" and "0000" composing a predetermined 8-bit redundant data "00000000" are multiplexed to predetermined 2 positions within the data block (to the head and center positions within the first Reed-Solomon code in the above example). This way of processing can also be applied to a case where the predetermined 8-bit redundant data "00000000" is multiplexed to a predetermined 1 position within the data block (e.g., to the head position within the first Reed-Solomon code) as shown in FIG. 12. This way of processing can still also applied to a case where 4 pairs of 2-bit redundant data "00," "00," "00" and "00" composing the predetermined 8-bit redundant data "00000000" are multiplexed to the predetermined 4 positions within the data block (e.g., to the head, ¼, ½ and ¾ positions within the first Reed-Solomon code) as shown in FIG. 14. Also, this way of processing can be applied almost exactly to a case where the predetermined 8-bit redundant data "00000000" is multiplexed as the 3-bit redundant data "000" and the 5-bit redundant data "00000," or in a case where the 2-bit redundant data "00" and the 6-bit redundant data "000000." Although it is not illustrated, multiplexition to the predetermined 8 positions within the data block can also be processed in the same way.

The bit t defying the Galois field element of the RS code can take any value. If t is changed, the RS encoder 13 and the parity part generator for j types of conversion 255 have a different configuration from that of the above example. In other words, the RS encoder 13 and the parity part generator for j types of conversion 255 are different in circuitry for $GF(2^8)$, $GF(2^4)$, $GF(2^2)$, etc. but the same in method as the above example.

Figure 13:
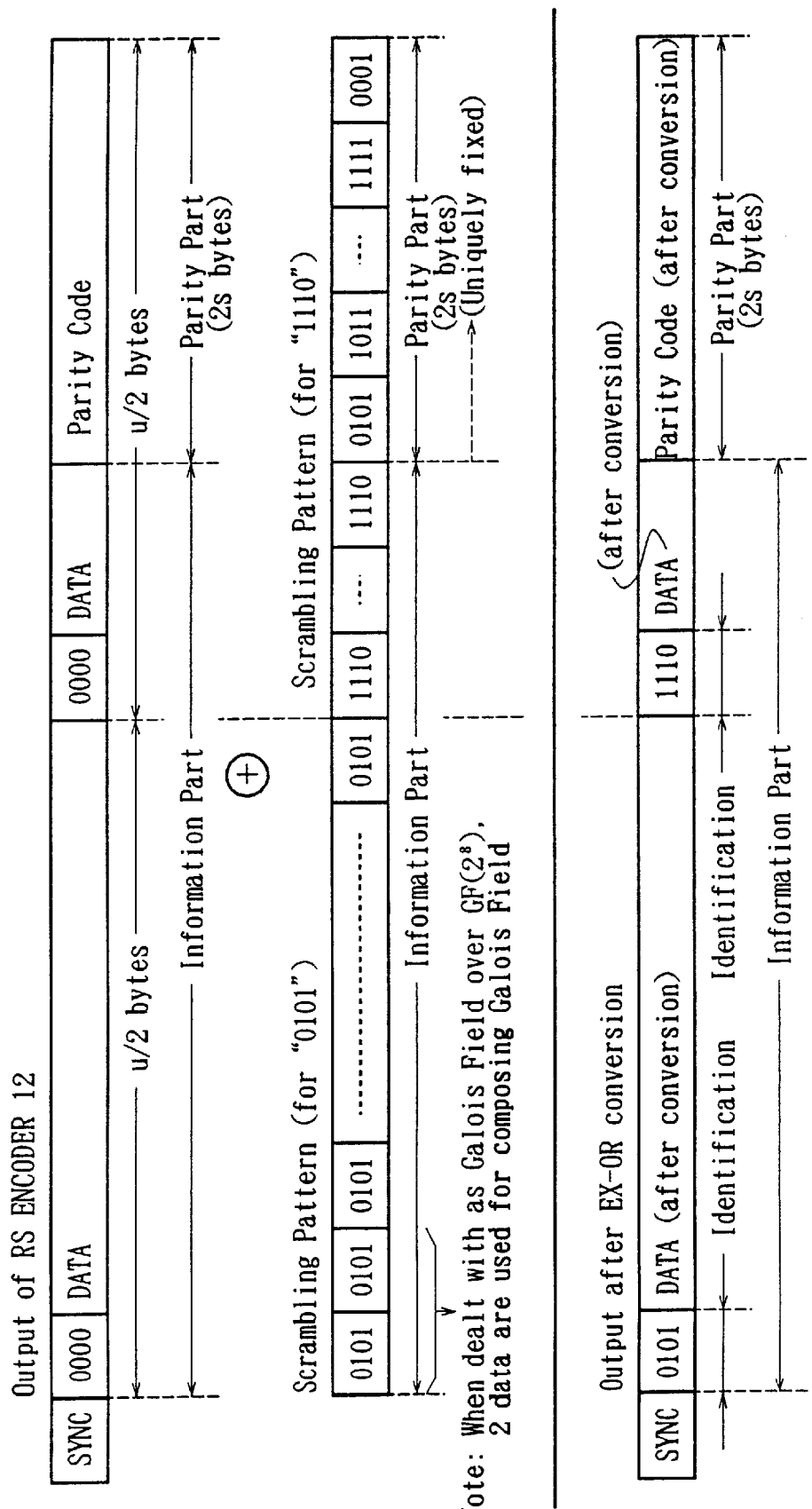
FIG. 13 is a descriptive chart showing a scrambling method and identification data for a case where the dummy data to be added at the head of the data block is set to 4 bits.

RLL decoding, RS decoding and the inverse conversion using RS code is preconditioned that the bit synchronization has been achieved. For this reason, in FIGS. 12 through 14, SYNC is added to the RS code for easier understanding. When the bit synchronization can be achieved easier, longer insertion intervals of SYNC can be taken.

Figure 10:
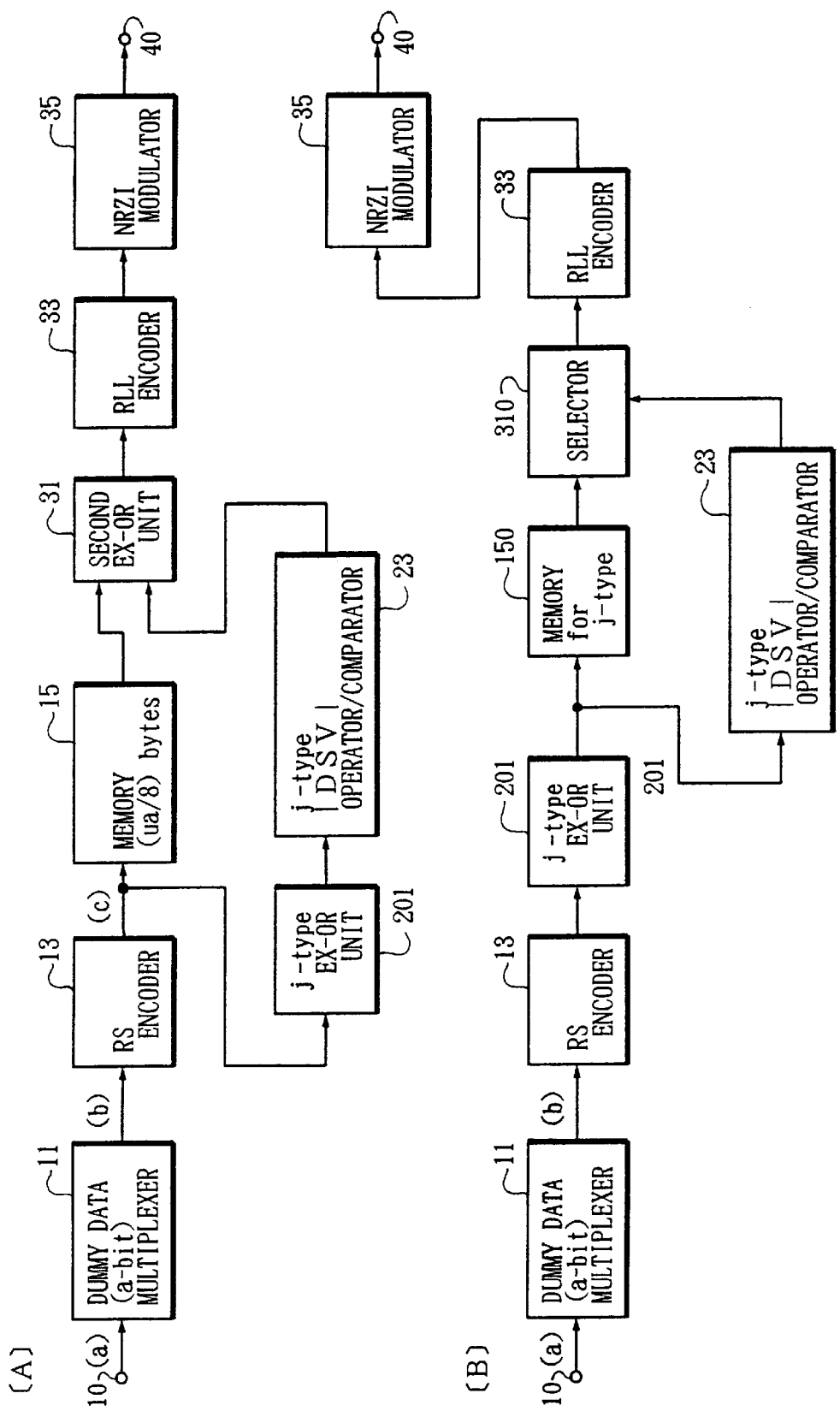
FIG. 10 are block diagrams showing modifications of the modulation circuit according to the embodiment.

FIG. 10 shows a modification of the modulation circuit. [A] shows an example configured like FIG. 5, while [B] shows an example in which all the j types of second Reed-Solomon codes (W"(x)) are stored in a memory 150. [A] is advantageous in that the capacity of a memory 15 can be small, while [B] is advantageous in that the second EX-OR unit 31 in [A] is not necessary.

The digital modulator shown in FIG. 10 [A] inputs a data stream and converts the data stream into a channel bit stream.

This digital modulator may be described as a digital modulator comprising a dummy data multiplexer 11 for multiplexing (a) predetermined redundant data as dummy data to (a) predetermined position(s) within each data block cut out of the data stream one by one, an RS encoder 13 for Reed-Solomon-encoding the above multiplexed data block as an information part and thereby generating a first Reed-Solomon code, a memory 15 for storing the first Reed-Solomon code output from the RS encoder 13, an j-type EX-OR unit 201 for adding j types of Reed-Solomon codes for scrambling, each of which has an identification data indicating a scrambling method in the same position as the above dummy data and code lengths of Reed-Solomon codes for scrambling are equal to that of above first Reed-Solomon code, and thereby generating j types of second Reed-Solomon codes, selector 23 for selecting a second Reed-Solomon code, among j types of second Reed-Solomon codes, which has such a desirable characteristic as having the minimum DC components in a channel bit stream and thereby outputting the Reed-Solomon code for scrambling used for generating the above selected second Reed-Solomon code, and a second EX-OR unit 31 for adding the first Reed-Solomon code from the memory 15 and the Reed-Solomon code for scrambling input from the selector 23 and thereby outputting a second Reed-Solomon code, which has such a desirable characteristic as having the minimum DC components in a channel bit stream.

On the other hand, the digital modulator shown in FIG. 10 [B] inputs a data stream and converts the data stream into a bit stream. This digital modulator may be described as a digital modulator comprising a dummy data multiplexer 11 for multiplexing (a) predetermined redundant data as dummy data to (a) predetermined position(s) within each data block cut out of the data stream one by one, an RS encoder 13 for Reed-Solomon-encoding the above multiplexed data block as an information part and thereby generating a first Reed-Solomon code, an j-type EX-OR unit 201 for adding j types of Reed-Solomon codes for scrambling, each of which has an identification data indicating a scrambling method in the same position as the above dummy data and codeword lengths of Reed-Solomon code for scrambling are equal to that of the above first Reed-Solomon code, and thereby generating j types of second Reed-Solomon codes, a memory 150 for storing j types of second Reed-Solomon codes, an selector 23 for selecting a second Reed-Solomon code, among j types of second Reed-Solomon codes, which has such a desirable characteristic as having the minimum DC components in a channel bit stream and thereby outputting information data specifying the above selected second Reed-Solomon code, and a selector 310 for outputting a second Reed-Solomon code specified by the identification data from the selector 23, among j types of second Reed-Solomon codes stored in the memory 150, as a second Reed-Solomon code which has such a desirable characteristic as having the minimum DC components in a channel bit stream.

Furthermore, both circuits shown in [A] and [B] of FIG. 10, respectively, may be so configured as comprising an RLL encoder 33 for RLL-coding a second Reed-Solomon code which has such a desirable characteristic as having the minimum DC components in a channel bit stream, and an NRZI modulator 35 for NRZI-modulating the output signal of the RLL encoder 33.

Figure 11:
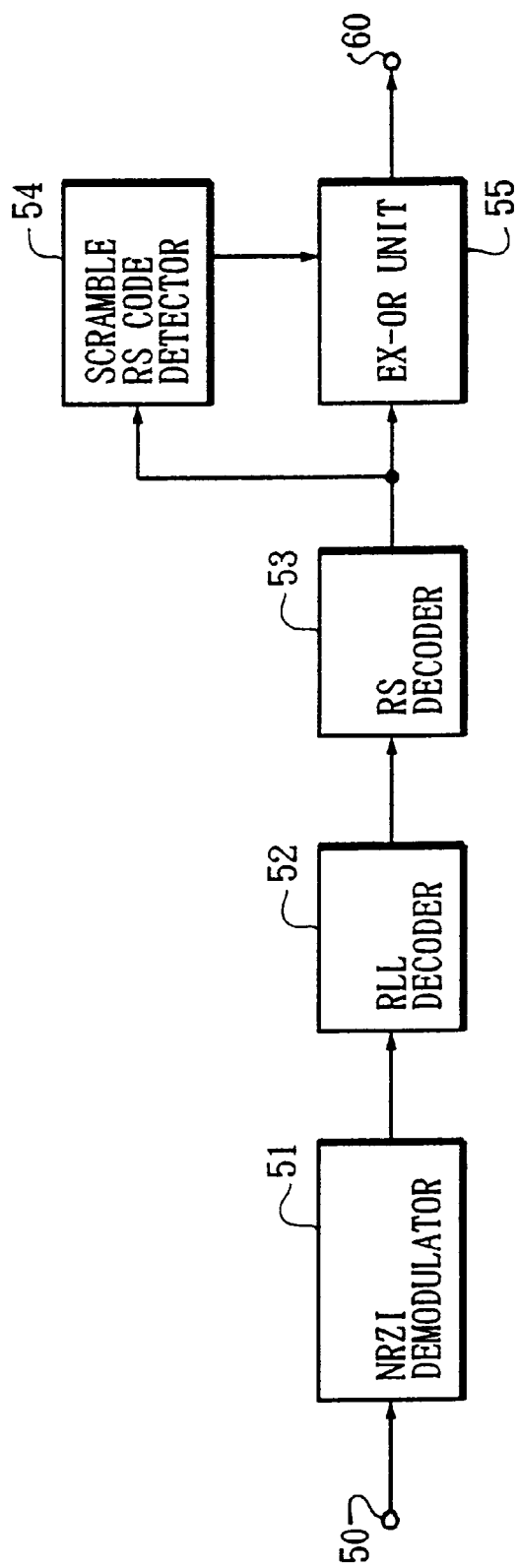
FIG. 11 is a block diagram of a demodulation circuit according to the embodiment.

The bit stream modulated as described above is demodulated by a demodulation circuit shown in FIG. 11. Specifically, the bit stream is demodulated by a digital demodulation circuit comprising an input terminal 50, an NRZI demodulator 51 for NRZI-demodulating a regenerated signal (channel bit stream) input from the input terminal 50, an RLL decoder 52 for RLL-decoding the NRZI-demodulated signal, an RS decoder 53 for error-correcting the RLL-decoded Reed-Solomon code by using the parity part, a detector 54 for detecting the Reed-Solomon code for scrambling used for the conversion of the Reed-Solomon code output from the RS decoder 53 after error correction (which corresponds to the best second Reed-Solomon code described above) according to the identification data multiplexed to the dummy data position to the above Reed-Solomon code, an EX-OR unit 55 for adding the Reed-Solomon code for scrambling detected by the detector 54 to the Reed-Solomon code error-corrected and output from the RS decoder 53, and an output terminal 60 for outputting the signal output from the EX-OR unit 55 to the outside.

Here, the detector 54 is assumed to memorize the data necessary for identifying the scrambling pattern used in the modulation circuit described above (e.g., 16 types of patterns shown in FIG. 8) in common with the modulation circuit, and also assumed to memorize the information of the dummy data described above (e.g., the information that the dummy data is "0000") in common with the modulation circuit.

Figure 15:
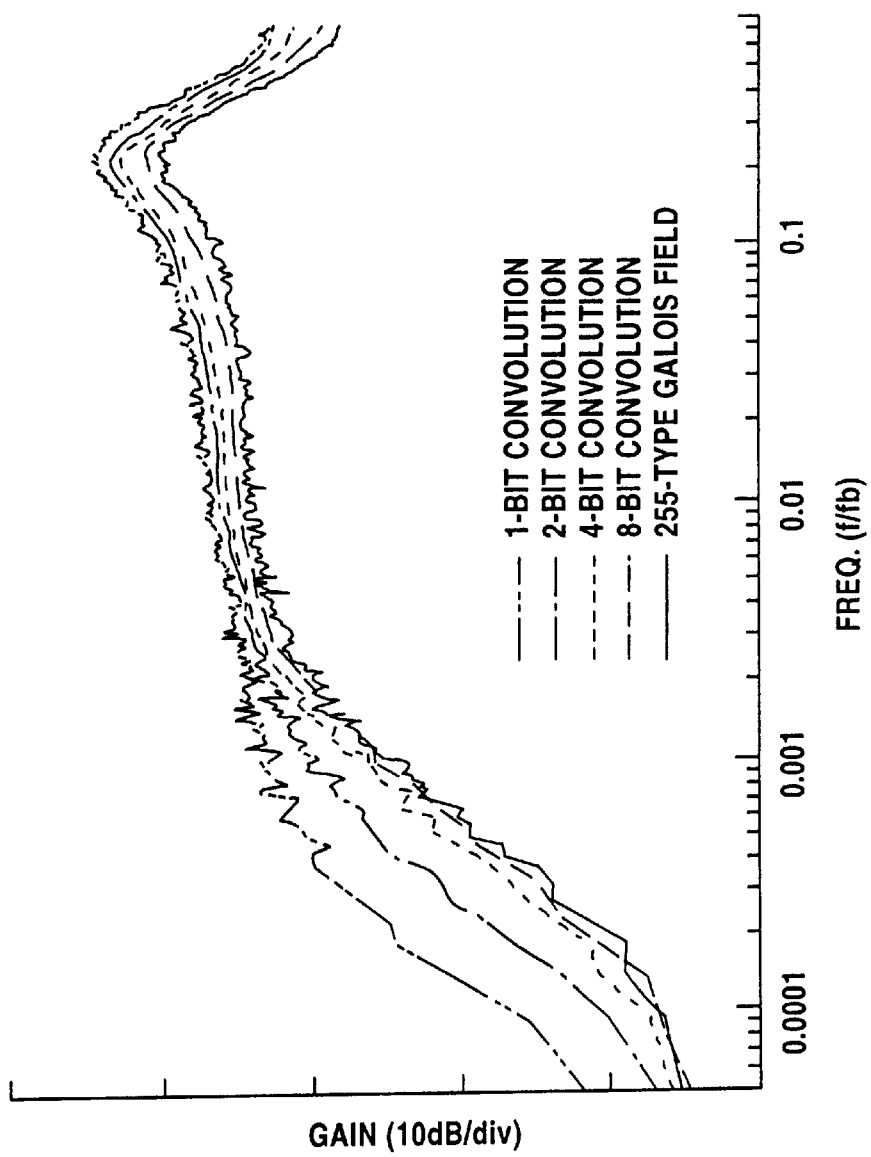
FIG. 15 is a comparative frequency characteristic chart of the convolutional type using 1 bit, 2 bits, 4 bits and 8 bits and the conversion by the Galois field multiplying type.
Figure 16:
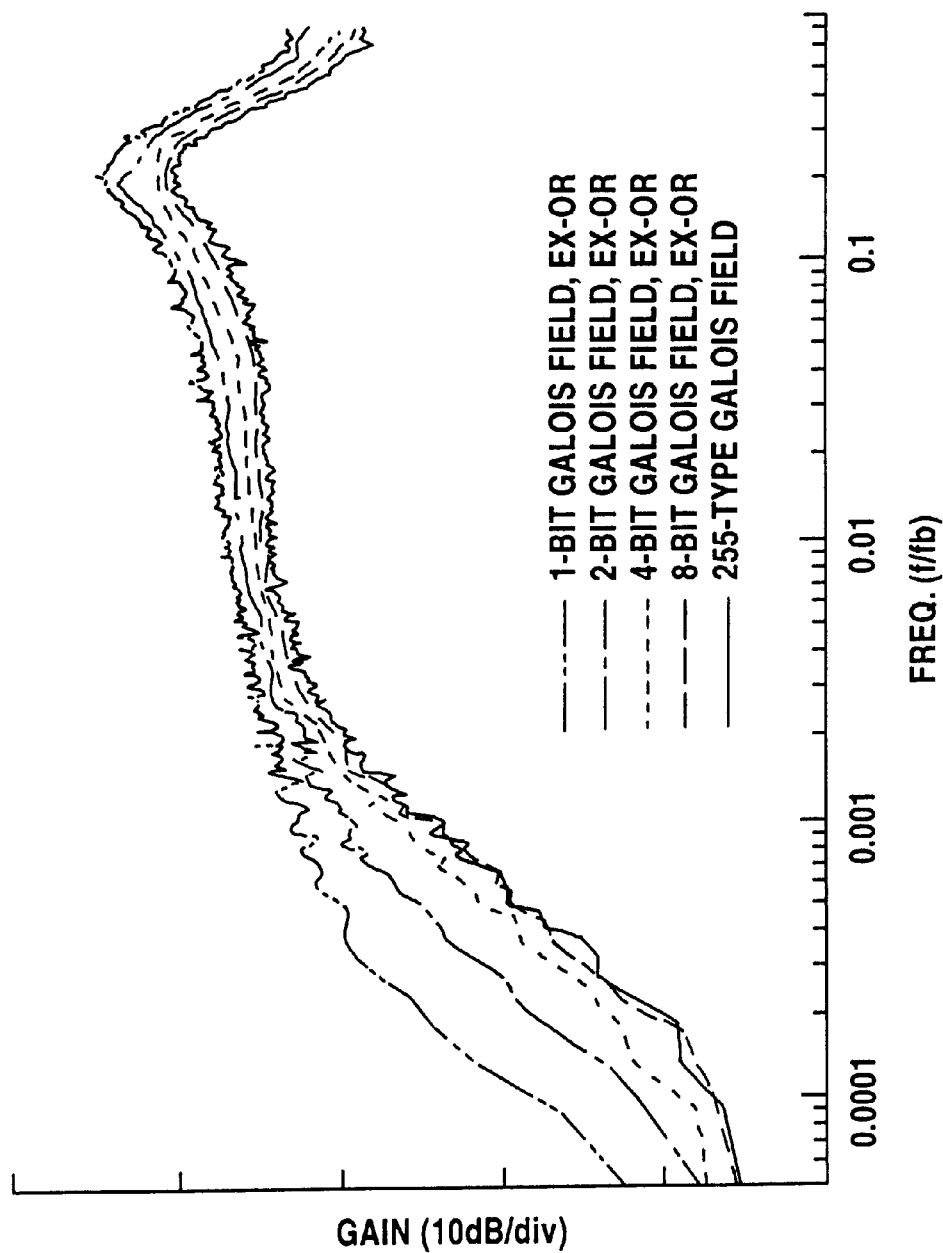
FIG. 16 is a comparative frequency characteristic chart of the Galois field addition type using the data of 1 bit, 2 bits, 4 bits and 8 bits and the conversion by the 255 types of Galois field multiplication type.
Figure 17:
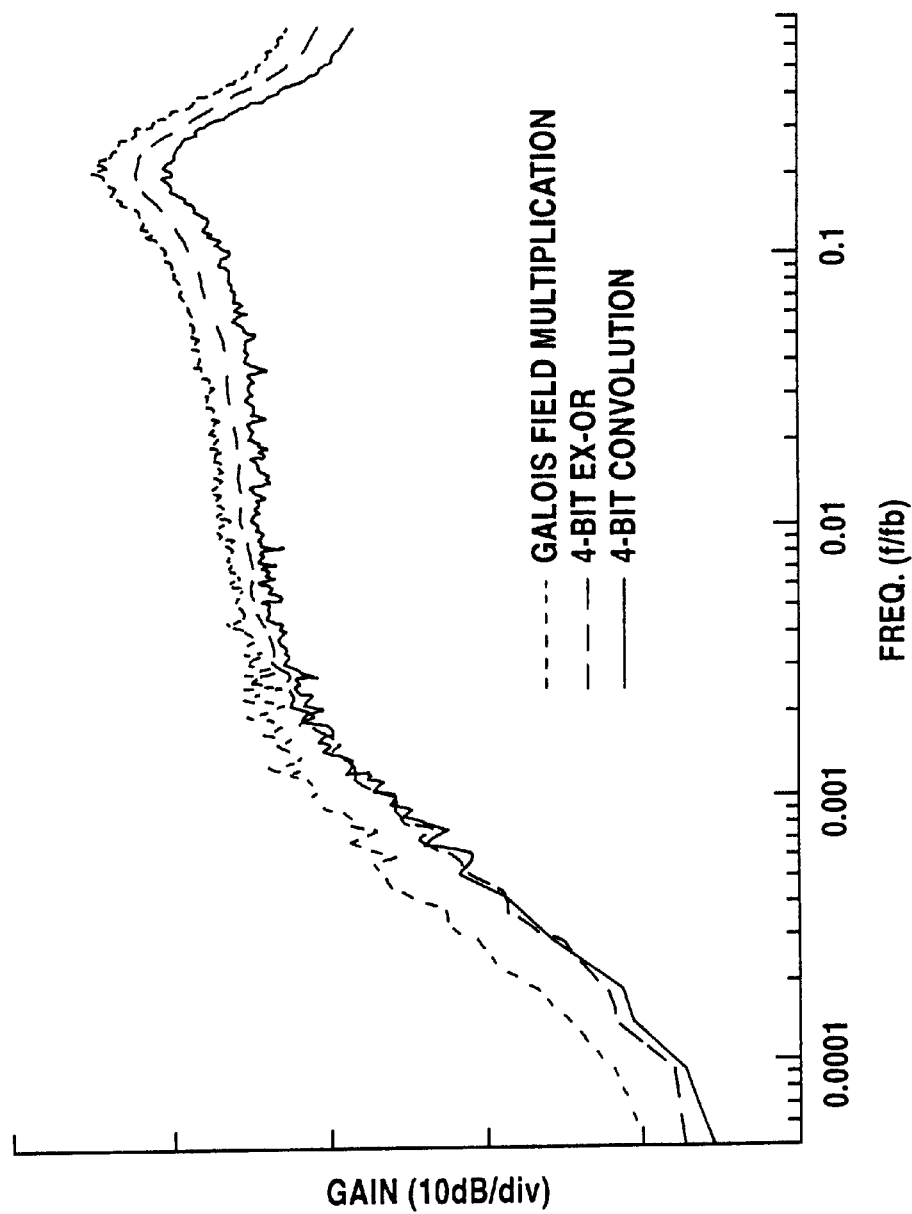
FIG. 17 is a comparative frequency characteristic chart of conversion of the 4-bit convolutional type, the Galois field addition method using the 4-bit dummy data and the 255 types of Galois field multiplication type.
Figure 18:
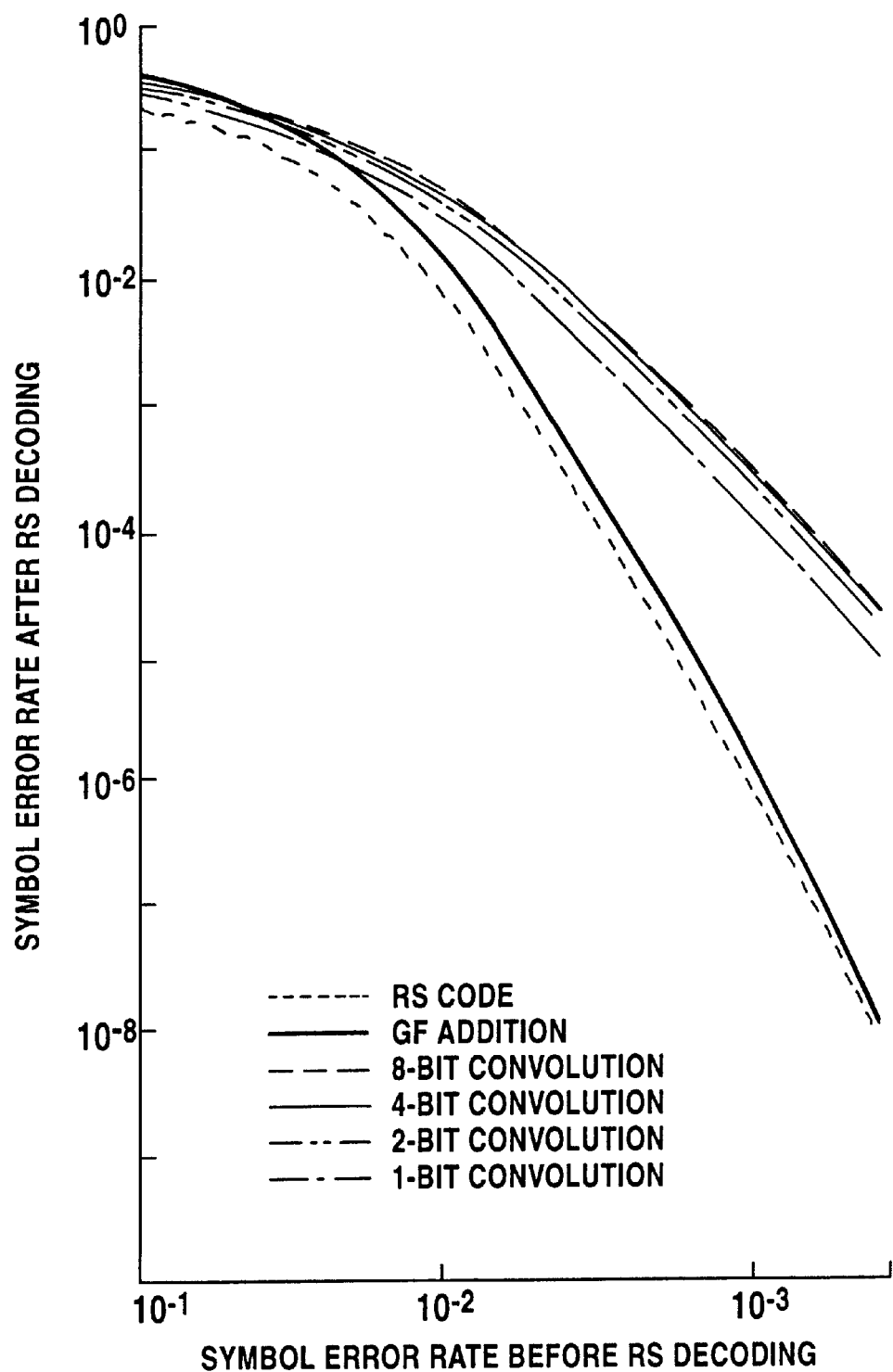
FIG. 18 is a characteristic chart showing the symbol error ratios of the RS code, the Galois field addition type (1-position multiplication within the data block) on $GF(2^8)$ and convolutional processing (1 bit, 2 bits, 4 bits and 8 bits).

FIGS. 15 through 17 are frequency characteristic charts showing the effects of the convolutional processing and Galois filed addition type processing according to the present invention in comparison with the Galois field multiplication type processing. FIG. 18 is a characteristic chart showing the symbol error rate of the RS code, the Galois field addition type processing on $GF(2^8)$ (1-position multiplication within the data block) and convolutional processing (1, 2, 4 and 8 bits). Here, the symbol error rate of the Galois field multiplication processing is not illustrated as it is almost the same as the Galois field addition type processing.

The convolutional processing generates j types of converted data blocks by performing EX-OR operation on every a-bits one by one from the head of the data block with j types of a bits multiplexed to the head of the objective data block, and selectively outputs the converted block with the minimum DC components, and thereby suppresses the DC components of the channel bit stream and prevents the propagation of the error. The demodulation of the convolutional processing is performed by performing EX-OR operation (inverse conversion) on every a-bits one by one from the block head of the regenerated block. The convolutional processing is described in the Japanese Applied Patent Application Nos. 8-87335, 8-291171 and 8-314306 of the applications made by the applicant of the present invention.

The Galois field multiplication type processing generates j types of converted data blocks by multiplying j types of elements over Galois fields to the objective data block multiplexed the dummy data (e.g., "11111111") over the Galois field ($2^t$) to the head thereof, and selectively outputs the converted data block with the minimum DC components, and thereby suppresses the DC components of the channel bit stream and enables the error correction. The demodulation of the Galois field multiplication type processing is performed by identifying the multiplied elements over Galois field, which is t bits multiplexed at the head of the regenerated data block, and divide the converted data block by the above identified element. The Galois field multiplication type processing is described in the Japanese Applied Patent Application Nos. 7-262141, 8-87335, 8-291171 and 8-314306, for example, of the applications made by the applicant of the present invention.

As evident from FIGS. 15 through 17, according to the present invention in which 2 pairs of 4-bit redundant data "0000" and "0000" composing a predetermined 8-bit redundant data "00000000" is multiplexed to predetermined 2 positions within a data block or the present invention in which a predetermined 8-bit redundant data "00000000" is multiplexed to a predetermined 1 position within a data block, these two frequency characteristics show nearly the one of 255 types of the Galois field multiplication processing, and the former invention has an effect that the circuitry of this case can be made much simpler in comparison with the 255 types of the Galois field multiplication processing. Furthermore, the processing according to the present invention in which 4 pairs of 2-bit redundant data "00," "00," "00" and "00" composing a predetermined 8-bit redundant data "00000000" is multiplexed to predetermined 4 positions within a data block can further simplified the circuitry and has satisfactory range of frequency characteristics. Here, FIGS. 16 and 17 show the results of simulation with 80-byte code length by using the element over $GS(2^8)$ as an RS code. As evident from FIG. 18, the characteristics of the symbol error rate of the Galois field addition processing are close to the characteristics of the RS code, and better than the characteristics of the convolutional processing. Here, FIG. 18 shows the results of simulation with information part of 72 bytes and parity part of 8 bytes.

As described above, according to the present invention, the multiplexed data block is generated by multiplexing dummy data to any position within each data block cut out of the data stream one by one, the first Reed-Solomon code is generated by Reed-Solomon-encoding this multiplexed data block as an information part, a plurality of second Reed-Solomon codes are generated by adding a plurality of Reed-Solomon codes for scrambling each of which has identification data showing its scrambling pattern in the same position as that of the above dummy data, and the codeword length of information part and parity part is the same as that of the above first Reed-Solomon code, and the second Reed-Solomon code in which the channel characteristics becomes desirable after modulation among the plurality of the second reed-Solomon codes is set for output. Therefore, the present invention has an effect that the channel bit stream of the desirable characteristics can be obtained. For example, when characteristic that the DC components of the channel bit stream is as small as the desirable frequency characteristic is employed, the present invention can have an effect that the DC or low-frequency components can be sufficiently suppressed, the regenerated error can be reduced, the propagation of the error can be reduced, and the circuitry can be made simpler.

In the above, the best second Reed-Solomon code in which the DC components can be minimized after NRZI modulation is selected among the candidates of second Reed-Solomon code. Alternatively, it may also be arranged that the (d, ∞) RLL code is used as the RLL code, and the second Reed-Solomon code in which the maximum time interval between adjacent transitions k can become minimum after modulation is selected. This modification can have an effect that precise clock can be easily extracted.

Furthermore, it may also be arranged that a new parameter is generated by adding some weighing to the parameters k and DSV and the second Reed-Solomon code in which the parameters can be minimized is selected. This modification has an effect that the precise clock can be extracted and at the same time the DC components of the modulated data can be suppressed.

What is claimed is:

1. A digital modulator which inputs a data stream to convert to a channel bit stream, comprising:

dummy data multiplexer for multiplexing a predetermined redundant data as dummy data to a predetermined position within a data block cut out of the data stream to generate a multiplexed data block;

an RS encoder for Reed-Solomon-encoding the multiplexed data block as an information part to generate a first Reed-Solomon code;

an adder for adding a plurality of types of Reed-Solomon codes for scrambling, each of which has an identification data indicating a scrambling pattern in the same position as the dummy data and each code length of the information part and parity part is equal to that of the information part and parity part of the first Reed-Solomon code, to generate a plurality of second Reed-Solomon codes; and a selector for selecting a second Reed-Solomon code having a desirable characteristic from among the second Reed-Solomon codes to output to an outside.

2. A digital modulator according to claim 1, wherein the selector selects a second Reed-Solomon code for being modulated to a channel bit stream having a minimum DC component.

3. A digital modulator according to claim 1, wherein the adder having a memory which outputs patterns for parity parts according to a pattern of the information part of the Reed-Solomon codes for scrambling.

4. A digital modulator according to claim 3, wherein the memory is a ROM.

5. A digital modulator according to claim 1, wherein the dummy data multiplexer multiplexes the first half and the second half of the predetermined redundant data as first half dummy data and second half dummy data to two predetermined positions within the data block, respectively, and wherein the plurality of types of Reed-Solomon codes for scrambling having the identification data consists of the first half part and the second half part in the same positions as the first and second half dummy data, respectively.

6. A digital modulator according to claim 1, wherein the dummy data multiplexer multiplexes the one part and the other part of the predetermined redundant data as dummy data to two predetermined positions within the data block, respectively, and wherein the plurality of types of Reed-Solomon codes for scrambling having the identification data consists of two parts having the same bit number of the corresponding dummy data and positioned in the same position as the corresponding dummy data, respectively.

7. A digital modulation method for converting an input data stream to a channel bit stream, comprising the steps of:

multiplexing a predetermined redundant data as dummy data to a predetermined position within a data block cut out of the input data stream to generate a multiplexed data block;

Reed-Solomon-encoding the multiplexed data block as an information part to generate a first Reed-Solomon code;

adding a plurality of types of Reed-Solomon codes for scrambling, each of which has an identification data indicating a scrambling pattern in the same position as the dummy data and has the same code length as the first Reed-Solomon code, to generate a plurality of second Reed-Solomon codes; and selecting a second Reed-Solomon code having a desirable characteristic from among the second Reed-Solomon codes to output to an outside.

8. A digital modulation method according to claim 7, wherein the desirable characteristic used for selecting the second Reed-Solomon code is that of minimizing DC component of a channel bit stream after modulation.

* * * * *